(12) United States Patent
Tio

(10) Patent No.: US 9,801,304 B2
(45) Date of Patent: Oct. 24, 2017

(54) COOLING FAN KIT

(71) Applicant: Rockwell Automation Technologies, Inc., Mayfield Heights, OH (US)

(72) Inventor: Donald Yuen Leong Tio, Singapore (SG)

(73) Assignee: ROCKWELL AUTOMATION TECHNOLOGIES, INC., Milwaukee, WI (US)

( * ) Notice: Subject to any disclaimer, the term of this patent is extended or adjusted under 35 U.S.C. 154(b) by 426 days.

(21) Appl. No.: 14/639,829

(22) Filed: Mar. 5, 2015

(65) Prior Publication Data

US 2016/0258446 A1 Sep. 8, 2016

(51) Int. Cl.

| H05K 7/20 | (2006.01) |
|---|---|
| F04D 29/64 | (2006.01) |
| F04D 29/58 | (2006.01) |
| F04D 29/60 | (2006.01) |
| F04D 25/12 | (2006.01) |
| F04D 29/52 | (2006.01) |
| F04D 29/62 | (2006.01) |
| F04D 29/42 | (2006.01) |

(52) U.S. Cl.
CPC ....... H05K 7/20172 (2013.01); F04D 29/582 (2013.01); F04D 29/601 (2013.01); F04D 25/12 (2013.01); F04D 29/4226 (2013.01); F04D 29/522 (2013.01); F04D 29/626 (2013.01); F04D 29/646 (2013.01)

(58) Field of Classification Search
CPC . H05K 7/20172; F04D 29/582; F04D 29/601; F04D 29/626; F04D 29/4226; F04D 29/522; F04D 29/646; F04D 25/12
See application file for complete search history.

(56) References Cited

U.S. PATENT DOCUMENTS

| 6,186,889 | B1 * | 2/2001 | Byrne | G06F 1/20 361/695 |
|---|---|---|---|---|
| 6,633,486 | B2 * | 10/2003 | Coles | H05K 7/20172 312/223.1 |
| 7,205,740 | B1 * | 4/2007 | Wei | F04D 25/166 318/434 |
| 7,515,413 | B1 * | 4/2009 | Curtis | G06F 1/20 165/104.33 |
| 7,572,100 | B2 * | 8/2009 | Strohm | F04D 29/023 361/695 |
| 2016/0050795 | A1 * | 2/2016 | Conn | H05K 7/1485 454/184 |

* cited by examiner

Primary Examiner — Zachary M Pape
(74) Attorney, Agent, or Firm — Fletcher Yoder, P.C.

(57) ABSTRACT

A cooling system for an automatic control component includes a frame. The frame includes a front side, a back side, a first side wall, and a second side wall. The cooling system also includes a stay coupled to the frame. Additionally, the cooling system includes a locking mechanism coupled to the front side of the frame. The locking mechanism is configured to move between a locked position and an unlocked position to secure the frame to a control module assembly. Moreover, the cooling system includes a fan positioned within the frame. The fan is configured to cool internal electronics of the control module assembly and the fan receives operative energy from the control module assembly. The cooling system also includes a printed circuit board secured within the stay and configured to receive power from the control module assembly and supply power to the fan.

20 Claims, 13 Drawing Sheets

COOLING FAN KIT

BACKGROUND

The present disclosure generally relates to cooling fans, and more particularly to a locking internal cooling fan for a control module assembly.

Industrial applications may utilize control module assemblies for a wide variety of control system designs. For example, the control module assembly may control operation of a drive for motor control applications. In certain embodiments, the control module assemblies may include internal cooling fans to cool electronics for improved reliability and/or performance. The cooling fans may be removable to enable maintenance procedures without dismantling the whole control module assembly. However, removal of the cooling fans may be time consuming or labor intensive. Accordingly, it is now recognized that it may be beneficial to develop a locking cooling fan that can be quickly and efficiently installed in and/or removed from the control module assembly.

BRIEF DESCRIPTION

In an embodiment, a cooling system for an automatic control component includes a frame. The frame includes a front side, a back side, a first side wall, and a second side wall. The cooling system also includes a stay coupled to the frame. Additionally, the cooling system includes a locking mechanism coupled to the front side of the frame. The locking mechanism is configured to move between a locked position and an unlocked position to secure the frame to a control module assembly. Moreover, the cooling system includes a fan positioned within the frame. The fan is configured to cool internal electronics of the control module assembly and the fan receives operative energy from the control module assembly. The cooling system also includes a printed circuit board secured within the stay and configured to receive power from the control module assembly and supply power to the fan.

In another embodiment, a system includes a control module assembly configured to control operation of an automated system. The system also includes an internal cooling module configured to engage the control module assembly. The internal cooling module facilitates cooling of internal electronic components of the control module assembly. The system further includes a projection of the control module assembly. The projection is configured to engage the internal cooling module and block removal of the internal cooling module from the control module assembly. Additionally, the system includes a fan of the internal cooling module. The fan is configured to operationally engage the control module assembly such that the control module assembly provides operational energy to the fan. The system also includes a power module assembly configured to receive the control module assembly. The power module assembly is configured to drive the projection of the control module assembly into engagement with the internal cooling module.

In another embodiment, a method includes guiding an internal cooling module into engagement with a control module assembly with ribs of the internal cooling module. The method also includes rotating a locking mechanism toward an installed position, in which an arm of the locking mechanism is substantially parallel to a side of a control module housing. The method further includes sliding the locking mechanism along a locking axis in a first locking direction and a second locking direction into a locked position such that the locking mechanism engages the side of the control module housing.

DRAWINGS

These and other features, aspects, and advantages of the present disclosure will become better understood when the following detailed description is read with reference to the accompanying drawings in which like characters represent like parts throughout the drawings, wherein.

Figure 1:
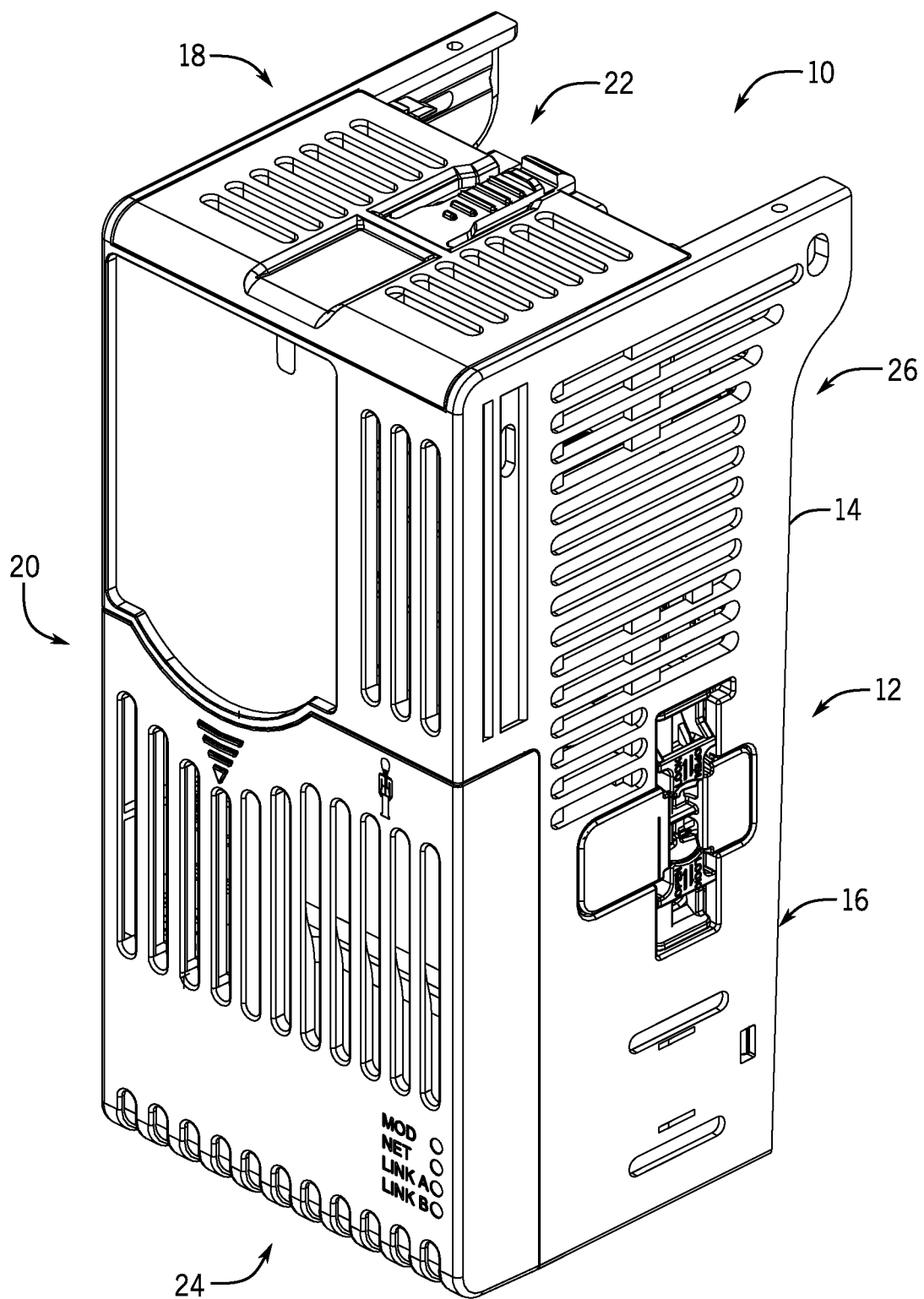
FIG. 1 is a perspective view of a control module assembly having an internal cooling module, in accordance with embodiments of the present disclosure.
Figure 2:
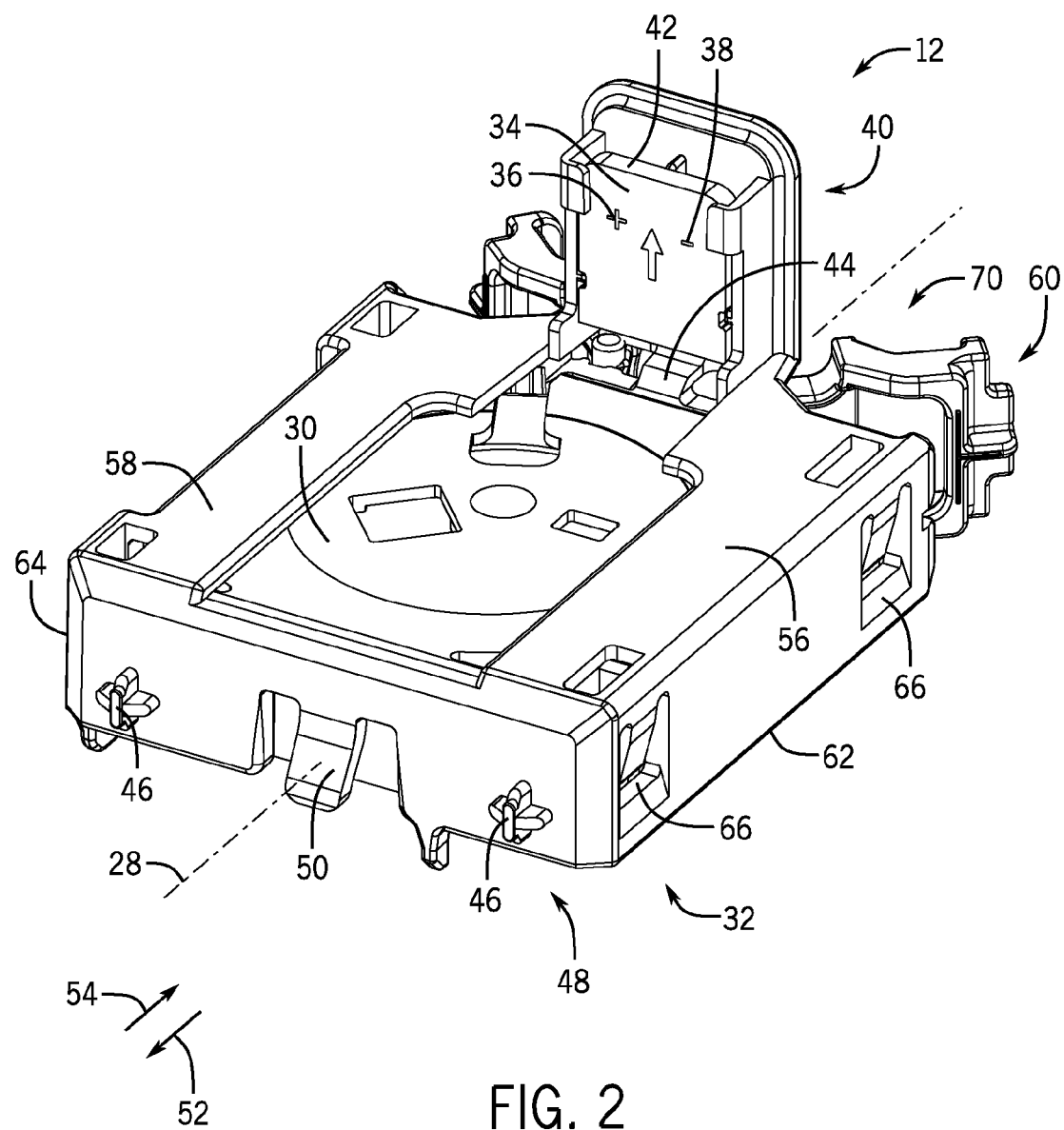
FIG. 2 is a perspective view of an internal cooling module, in accordance with embodiments of the present disclosure.
Figure 15:
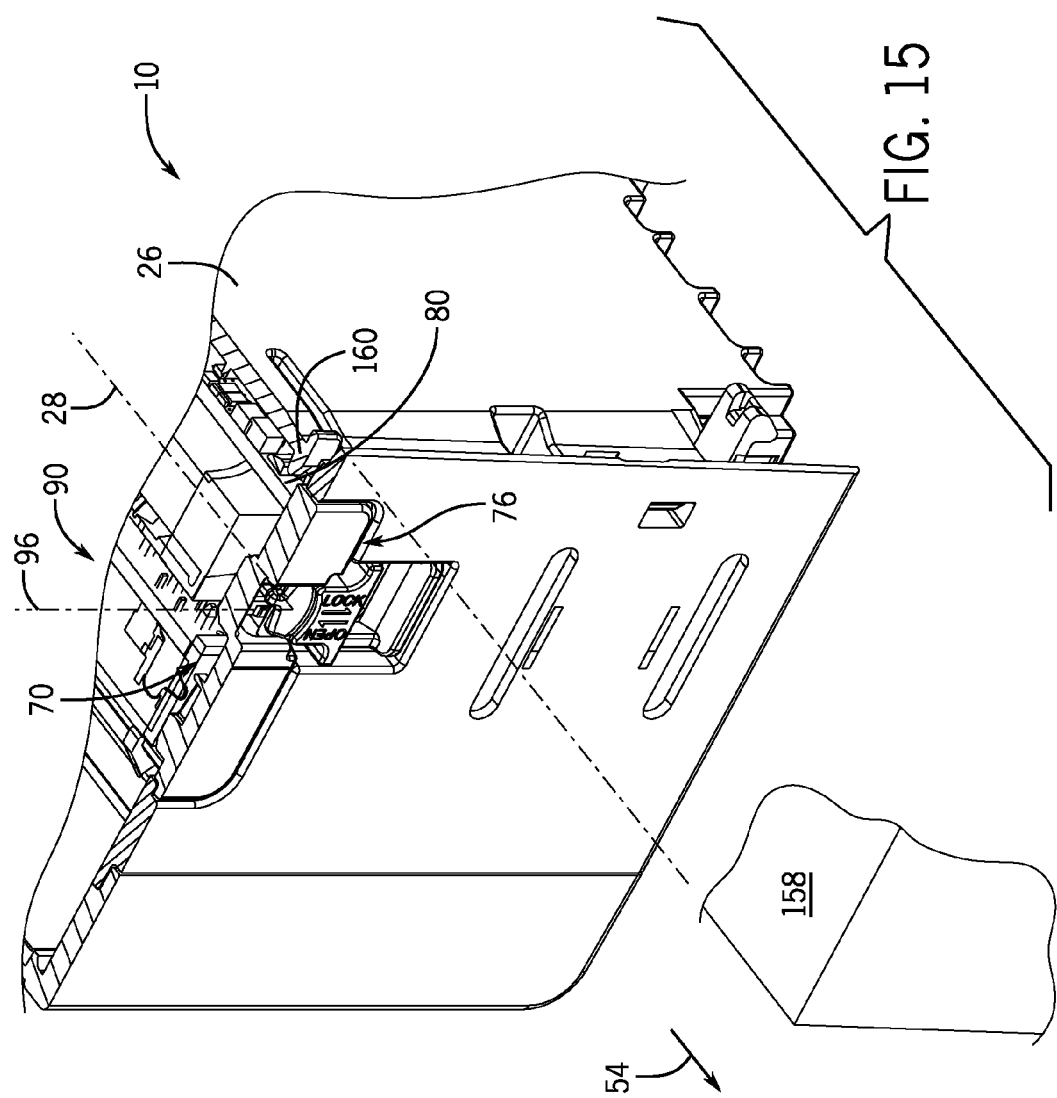
Figure 16:
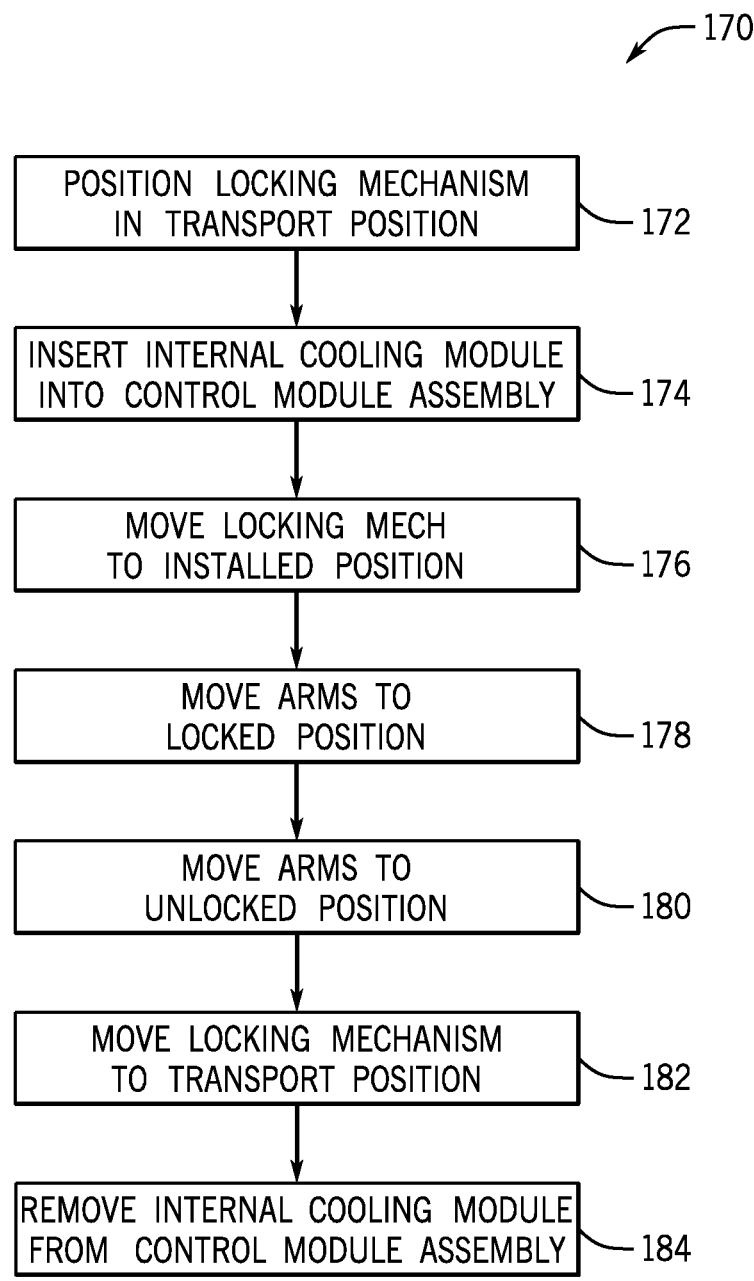

FIG. 15 is a partial cross-sectional view of an embodiment of the control module assembly of FIG. 1, in which the internal cooling module is positioned within the control module assembly, in accordance with embodiments of the present disclosure; and FIG. 16 is a flow chart of an embodiment of a method for installing and removing the internal cooling module of FIG. 2 from the control module assembly, in accordance with embodiments of the present disclosure.

DETAILED DESCRIPTION

While the present disclosure may be susceptible to various modifications and alternative forms, specific embodiments have been shown by way of example in the drawings and tables and have been described in detail herein. However, it should be understood that the embodiments are not intended to be limited to the particular forms disclosed. Rather, the disclosure is to cover all modifications, equivalents, and alternatives falling within the spirit and scope of the disclosure as defined by the following appended claims. Further, although individual embodiments are discussed herein to simplify explanation, the disclosure is intended to cover all combinations of these embodiments.

Embodiments of the present disclosure generally relate to an internal cooling module for a control module assembly. In certain embodiments, the internal cooling modules includes a fan configured to direct an air flow over internal electrical components of the control module assembly. The internal cooling module may include a frame configured to hold the fan in place relative to the internal electrical components. The frame may include fixed catches configured to hold the fan against the frame and spring catches configured to drive the fan toward the frame. As a result, the fan may be securely fastened to the frame. Additionally, in certain embodiments, the frame may include a stay configured to hold a printed circuit board (PCB) that directs operational energy to the fan. The stay may arrange the PCB relative to the frame such that the PCB couples to an associated electrical connector positioned within the control module assembly. In certain embodiments, the connection between the connector and the PCB is a substantially right angle connection, thereby reducing the likelihood of misalignment. The internal cooling module may be configured to lock to the control module assembly (e.g., to a control module housing) to block removal of the internal cooling module during operation. For example, the internal cooling module may include a locking mechanism, positioned on the frame, which engages the control module housing to substantially secure the internal cooling module to the control module assembly. The locking mechanism may be movable between a locked position and an unlocked position to enable installation and removal of the internal cooling module without additional tooling or fasteners. Accordingly, certain embodiments of the present disclosure are directed toward the internal cooling module which may secure to the control module assembly to enable cooling of the internal electrical components.

FIG. 1 is a perspective view of an embodiment of a control module assembly 10 having an internal cooling module 12. For example, the control module assembly 10 may be an AC drive configured to control the speed of an electric motor. Moreover, the internal cooling module 12 is coupled to the control module assembly 10 to provide cooling for internal electronic components. For example, the internal cooling module 12 may include a fan to direct an air flow over the electronic components to facilitate cooling during operation. As shown, the internal cooling module 12 is disposed within a housing 14 of the control module assembly 10. In certain embodiments, the internal cooling module 12 may engage the housing 14 on a first side 16 (e.g., a right side panel) such that removal of the internal cooling module 12 is substantially blocked while a locking mechanism of the internal cooling module 12 is in a locked position. For example, the locking mechanism may be configured to engage the housing 14. However, in other embodiments, the internal cooling module 12 may be coupled to a second side 18 (e.g., a left panel), a third side 20 (e.g., a front panel), a fourth side 22 (e.g., a top panel), a fifth side 24 (e.g., a bottom panel), or a sixth side 26 (e.g., a back panel). It will be appreciated that the location of the internal cooling module 12 within the housing 12 may be particularly selected to accommodate the size of the control module assembly 10, the configuration of the control module assembly 10, and/or the internal electronic layout of the control module assembly 10.

FIG. 2 is a perspective view of an embodiment of the internal cooling module 12. The following discussion of the internal cooling module 12 may make reference to a longitudinal axis 28 configured to be substantially perpendicular to the first side 16 of the control module assembly 10 while the internal cooling module 12 is installed in the control module assembly 10. As used herein, substantially perpendicular refers to an alignment between two surfaces of approximately 90 degrees, plus or minus 15 degrees. As described above, the internal cooling module 12 includes a fan 30 disposed within a frame 32 of the internal cooling module 12. In the illustrated embodiment, the fan 30 is configured to direct an air flow toward the internal electronic components of the control module assembly 10. For example, the fan 30 may include an impeller and power source to direct the air flow at a designated flow rate to facilitate circulation of air through the cooling module 12. In certain embodiments, the fan 30 receives electrical power from a printed circuit board (PCB) 34 configured to couple to the control module assembly 10 (e.g., to couple to an associated connector). For example, a first contact pad 36 and a second contact pad 38 may align with the associated connector(s) to electrically and/or communicatively couple the internal cooling module 12 (e.g., the fan 30) to the control module assembly 10. As a result, the internal cooling module 12 may not include a stored power source (e.g., a battery, a capacitor, a solar cell) because operational energy may be drawn from the control module assembly 10 via the PCB 34.

In the illustrated embodiment, the PCB 34 is disposed within a stay 40 of the frame 32. The stay 40 is configured to secure the PCB 34 to the frame 32 and to align the PCB 34 with the associated connector of the control module assembly 10 such that the first and second contacts 36, 38 are operatively coupled to the associated connector(s). In certain embodiments, the stay 40 may include features that block insertion of the PCB 34 in an orientation that does not align with the associated connector. For example, the dimensions of the stay 40 may be particularly selected to align the PCB 34 in a particularly selected orientation. In the illustrated embodiment, the PCB 34 is substantially perpendicular to the longitudinal axis 28. That is, the first and second contacts 36, 38 are oriented toward the fan 30. Moreover, in other embodiments, the stay 40 may include protrusions or recesses configured to engage the PCB 34 in the particularly selected orientation and block the PCB 34 in the different orientation. As shown in FIG. 2, the stay 40 may include a first grip 42 and a second grip 44. The first and second grips 42, 44 may be configured to lock the PCB 34 into the stay 40, thereby limiting or blocking unintentional removal or movement of the PCB 34. For instance, the first and second grips 42, 44 may engage the PCB 34 via an interference fit to hold the PCB 34 in place. Additionally, in some embodiments, the second grip 44 may drive the PCB 34 toward the first grip 42, thereby locking the PCB 34 between the first and second grips 42, 44. Accordingly, the PCB 34 may be secured to the frame 32 to provide operational energy and/or operating instructions to the fan 30.

Furthermore, as shown in FIG. 2, the frame 32 includes ribs 46 (e.g., alignment ribs) positioned on a back side 48. The ribs 46 are configured to facilitate alignment of the frame 32 with the control module assembly 10 while the internal cooling module 12 is inserted into the control module assembly 10. For example, the control module assembly 10 may include corresponding recesses configured to receive the ribs 46. As shown, the ribs 46 extend axially away from the frame 32 along the longitudinal axis 28 to form protrusions. In the illustrated embodiment, the ribs 46 are generally cross-shaped or plus-shaped. However, in other embodiments, the ribs 46 may be arcuate, polygonal, or any other reasonable shape. Moreover, the ribs 46 may provide support and/or protection from shocks and/or vibrations to the control module assembly 10. For example, while the ribs 46 are positioned within the corresponding recesses, the ribs 46 may provide protection in at least two directions (e.g., protection from generally upward forces, protection from generally transverse forces). As a result, the ribs 46 may improve the attachment and/or alignment of the internal cooling module 12 with the control module assembly 10.

In the illustrated embodiment, the frame 32 also includes a release spring 50 on the back side 48. As shown, the release spring 50 extends from the frame 32 and is biased in a first direction 52. That is, the release spring 50 is configured to exert a force that drives the internal cooling module 12 in a second direction 54 while the release spring 50 is compressed. The release spring 50 may facilitate removal of the internal cooling module 12 from the control module assembly 10. For example, as will be described below, the release spring 50 may drive the internal cooling module 12 in the second direction 54 while the locking mechanism is unlocked (e.g., deactivated, in a disengaged position). As a result, removal of the internal cooling module 12 may not utilize additional tools (e.g., screw drivers, pliers, wrenches) because the release spring 50 is configured to drive the internal cooling module 12 away from the control module assembly 10 while the locking mechanism is unlocked. Moreover, the release spring 50 may provide a visual indication to an operator that the internal cooling module 12 is not fully inserted into the control module assembly 10. For instance, the operator may overcome the biasing force of the release spring 50 to fully insert the internal cooling module 12 in the control module assembly 10, thereby enabling the locking mechanism to lock the internal cooling module 12 in place. However, if the internal cooling module 12 is not fully inserted into the control module assembly 10, the locking mechanism may be blocked from locking the internal cooling module 12 to the control module assembly 10. As a result, no operational power may be supplied to the fan 30 from the control module assembly 10. Accordingly, the release spring 50 may block locking of the locking mechanism and provide an indication to the operator that the internal cooling module 12 is not fully inserted into the control module assembly 10.

In the illustrated embodiment, the frame 32 includes platforms 56, 58 to support the fan 30 while the fan 30 is positioned within the frame 32. As shown, the platforms 56 extend from a front side 60 to the back side 48. Moreover, the platforms 56, 58 are coupled (e.g., integral with) to a respective first side wall 62 and a second side wall 64. In the illustrated embodiment, the platforms 56, 58 are integrally formed with the frame 32. In certain embodiments, the frame 32 may be formed from plastic or other non-electrically conductive materials to enable a lightweight and structurally supportive enclosure for the fan 30.

To facilitate coupling of the fan 30 to the frame 32, the first side wall 62 includes spring catches 66. The spring catches 66 are biased toward the second side wall 64 and are configured to drive the fan 30 toward the second side wall 64. Accordingly, the fan 30 may be securely held within the frame 32 due to the force exerted on the fan 30 by the spring catches 66. In certain embodiments, the spring catches 66 are integrally formed with the frame 32.

As described above, in the illustrated embodiment, the internal cooling module 12 includes a locking mechanism 70. The locking mechanism 70 is configured to secure the internal cooling module 12 to the control module assembly 10. Moreover, the locking mechanism 70 is configured to enable attachment of the internal cooling module 12 to the control module assembly 10 without utilizing additional tools or fasteners (e.g., screws, bolts, adhesives). For instance, the locking mechanism 70 may include locking features that engage structural supports (e.g., the first side 16, the second side 18) of the control module assembly 10 to secure the internal cooling module 12 within the control module assembly 10. In the illustrated embodiment, the locking mechanism 70 is positioned on the front side 60 of the frame 32, opposite the release spring 50. As will be described in detail below, the locking mechanism 70 is configured to secure the internal cooling module 12 to the control module assembly 10.

Figure 3:
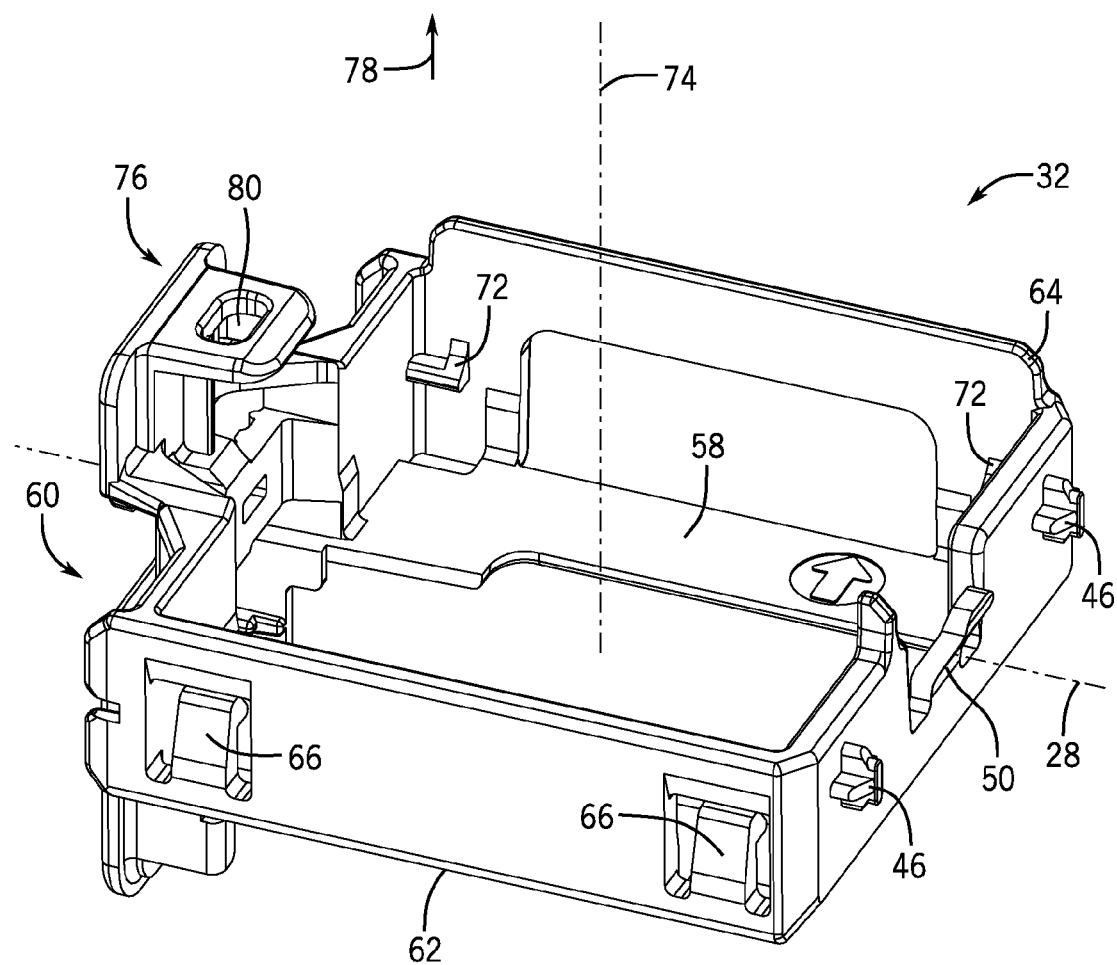
FIG. 3 is a perspective view of a frame of the internal cooling module of FIG. 2, in accordance with embodiments of the present disclosure.

FIG. 3 is a perspective view of an embodiment of the frame 32. In the illustrated embodiment, the frame 32 includes fixed catches 72 configured to support the fan 30 and drive the fan 30 toward the platform 58. The fixed catches 72 are positioned on the second side wall 64, opposite the spring catches 66 on the first side wall 62. The fan 30 is configured to be positioned between the fixed catches 72 and the platform 58 to block vertical movement (e.g., movement along a transverse axis 74) of the fan 30. In the illustrated embodiment, the fixed catches 72 are integrally formed into the frame 32. However, in other embodiments, the fixed catches 72 may be separately attached to the frame 32. The fixed catches 72 are configured to work with the spring catches 66 to secure the fan 30 to the frame 32.

In the illustrated embodiment, the frame 32 includes a latching feature 76 configured to couple the internal cooling module 12 to the control module assembly 10. The latching feature 76 is positioned on the front side 60 of the frame 32 and extends in a third direction 78 along the transverse axis 74, opposite the stay 40. The latching feature 76 includes a recess 80 configured to receive a projection coupled to the control module assembly 10. The projection engages the recess 80 and blocks removal of the internal cooling module 12 from the control module assembly 10. As will be described below, in certain embodiments, the projection may be configured to engage the recess 80 while the control module assembly 10 is coupled to the power module assembly and to disengage the recess 80 while the control module assembly 10 is not coupled to the power module assembly.

Figure 4:
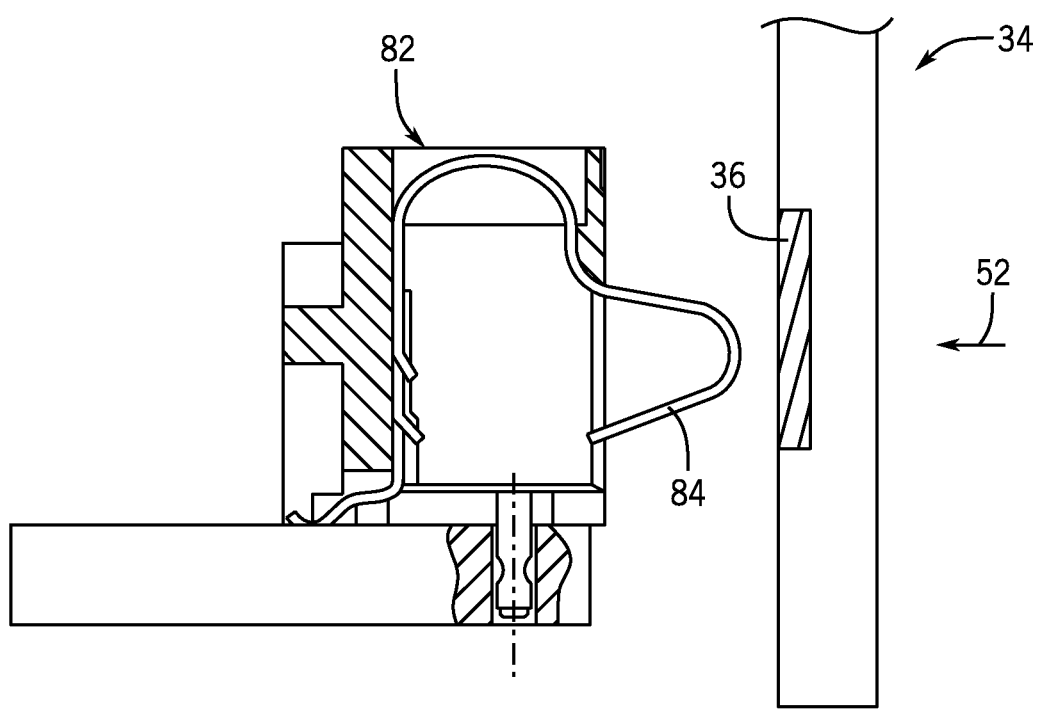
FIG. 4 is a schematic cross-sectional view of a printed circuit board and a connector of the internal cooling module of FIG. 2, in accordance with embodiments of the present disclosure.

FIG. 4 is a schematic cross-sectional side view of an embodiment of the PCB 34 and a connector 82, in which the PCB 34 moves into contact with the connector 82 while the locking mechanism 70 is locked. In the illustrated embodiment, the PCB 34 includes the first contact 36 configured to engage a pin 84 (e.g., a leaf spring) of the connector 82. As discussed above, the connector 82 provides operational energy to the PCB 34, thereby supplying operational energy to the fan 30. The pin 84 engages the first contact 36 to complete the electrical circuit as the PCB 34 is moved in the first direction 52 (e.g., into the control module assembly 10). The connector 82 and the PCB 34 are arranged at substantially a right angle, in the illustrated embodiment. As a result, the likelihood of interference or misalignment may be reduced because the PCB 34 is moved directly into contact with the connector 82 in the first direction 52.

Figure 5:
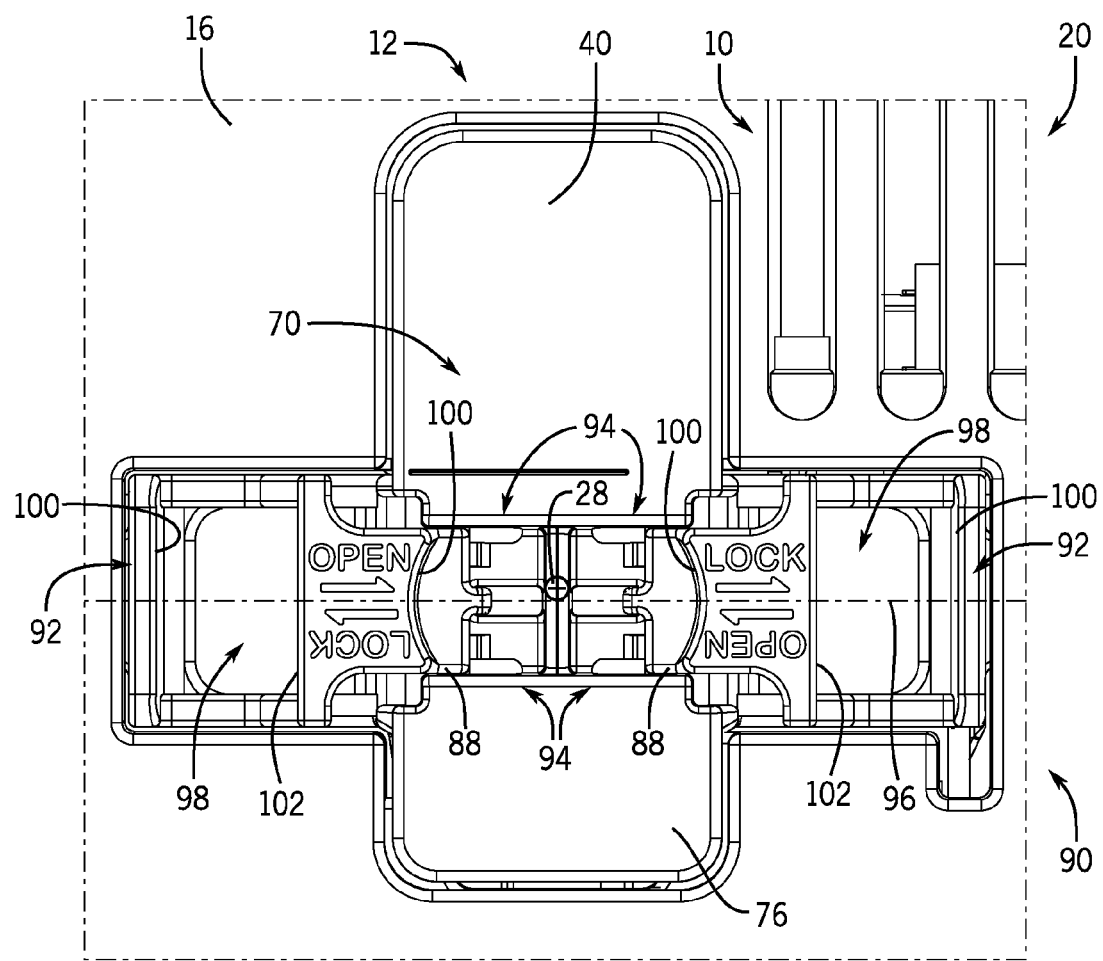
FIG. 5 is a front view of an embodiment of the internal cooling module of FIG. 2 positioned within a control module assembly, in accordance with embodiments of the present disclosure.

FIG. 5 is a front view of an embodiment of the internal cooling module 12 positioned within the control module assembly 10, in which the locking mechanism 70 is in a locked orientation or position 90 (e.g., an activated position, an engaged position). In the illustrated embodiment, the locking mechanism 70 includes arms 92 configured to transition the locking mechanism 70 between the locked position 90 and an unlocked position. The arms 92 are coupled to pockets 94 of the stay 40 and the latching feature 76 via rotation features 88. The rotation features 88 enable the arms 92 to rotate about a rotational axis of the rotation features 88 to facilitate insertion and removal of the internal cooling module 12. For example, rotation about the rotational axis may enable the arms 92 to swing outward from the first side 16 of the control module assembly 10.

As will be described in detail below, the arms 92 are configured to slide within the pockets 94 along a locking axis 96 to transition between the locked position 90 and the unlocked position. The arms 92 include cavities 98 that enable the operator to engage the arms 92. For example, the operator may engage the arms 92, by inserting fingers into the cavities 98, to move the locking mechanism 70 into the unlocked position from the locked position 90 by performing a pinching movement with the inserted fingers. In certain embodiments, the cavities 98 are particularly shaped to accommodate a range of potential operators. For example, the cavities 98 may be shaped based on ergonomic sizing charts. Moreover, in the illustrated embodiment, the arms 92 include locking edges 100 and unlocking edges 102. The locking edge 100 is configured to facilitate movement of the arms 92 along the locking axis 96 and into the locked position 90. Additionally, the unlocking edge 102 is configured to facilitate movement of the arms 92 along the locking axis 96 and into the unlocked position. As a result, the operator may install and remove the internal cooling module 12 without utilizing additional tools.

Figure 6:
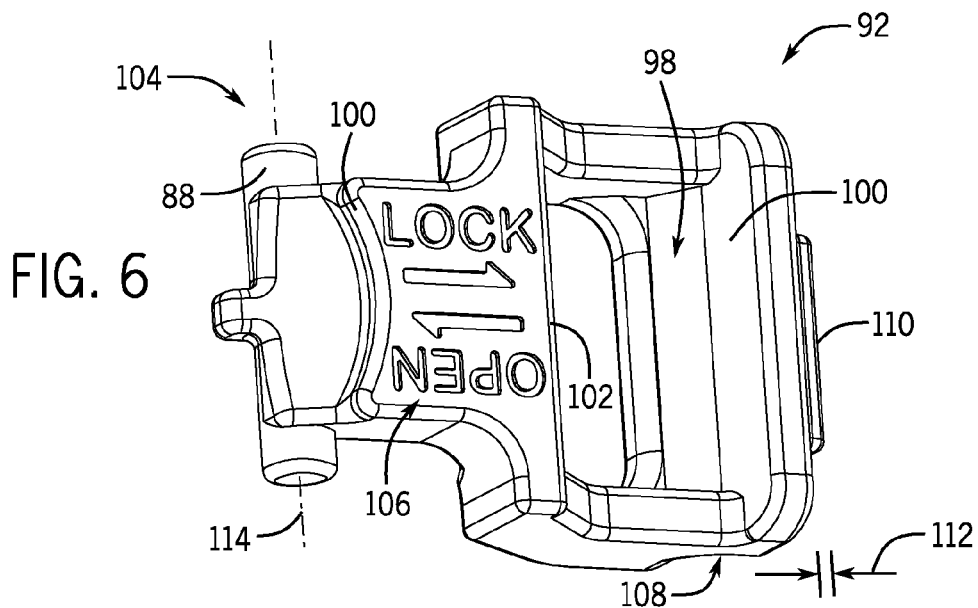
FIG. 6 is a perspective view of an embodiment of a forward side of an arm of a locking mechanism, in accordance with embodiments of the present disclosure.

FIG. 6 is a perspective view of an embodiment of a forward side 104 of the arm 92. A first portion 106 of the forward side 104 is configured to be substantially flush with the first side 16 of the control module assembly 10 while the locking mechanism 70 is in the locked position 90. However, as shown, a second portion 108 is recessed in the first direction 52, relative to the first portion 106. In other words, the first portion 106 is farther outward along the longitudinal axis 28 than the second portion 108. Recessing the second portion 108 enables a locking feature 110 to engage the control module assembly 10 to secure the internal cooling module 12 to the control module assembly 10. As shown, the locking feature 110 is a protrusion extending from the second portion 108 a first length 112. The first length 112 is particularly selected to enable engagement of the control module assembly 10 while the locking mechanism is in the locked position 90 and to prevent or block engagement of the control module assembly 10 while the locking mechanism is in the unlocked position.

In the illustrated embodiment, the arm 92 includes a rotation axis 114 of the rotation feature 88 that is configured to facilitate rotation of the arm 92 while the rotation feature 88 is disposed within the pockets 94. As will be described below, the arm 92 may rotate about the rotation axis 114 to transition between a transport position and an installed position. Moreover, the rotation feature 88 may slide along the locking axis 96 within the pockets 94 to transition the arms 92 between the locked and unlocked positions.

Figure 7:
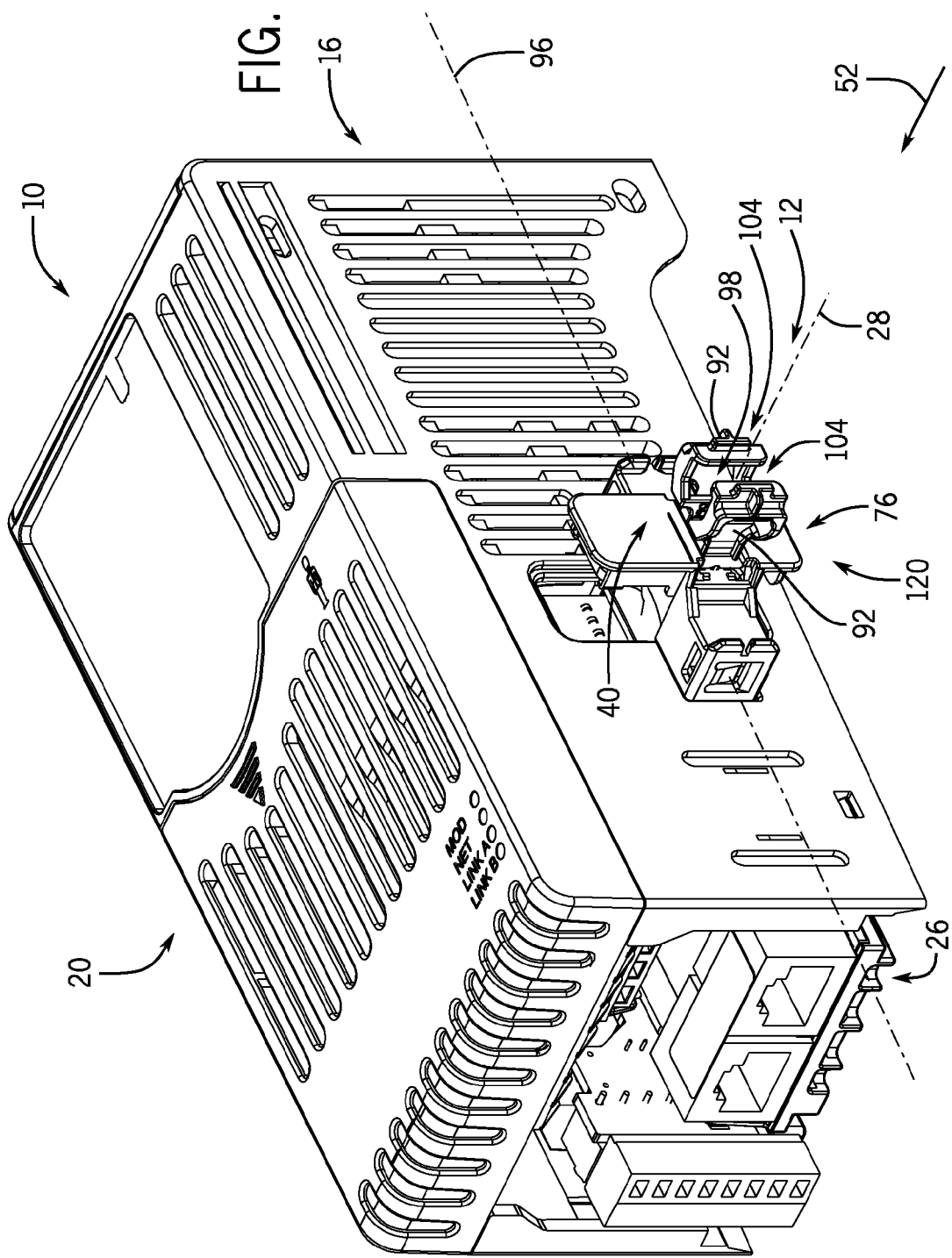
FIG. 7 is a perspective view of the control module assembly of FIG. 1 with the internal cooling module in a transport position, in accordance with embodiments of the present disclosure.
Figure 8:
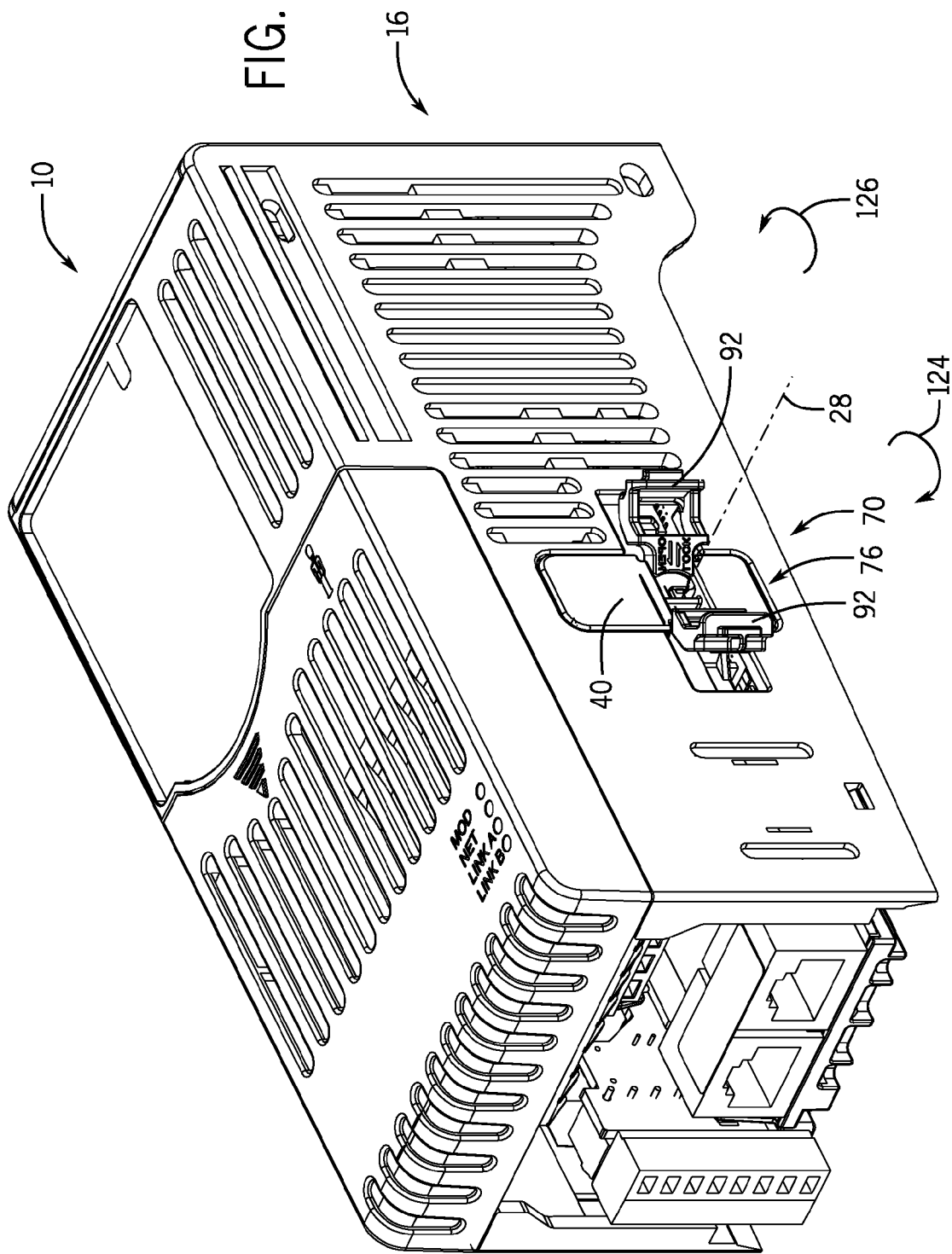
FIG. 8 is a perspective view of the internal cooling module of FIG. 2 positioned within the control module assembly, in which a locking mechanism is transitioning toward an installed position, in accordance with embodiments of the present disclosure.
Figure 9:
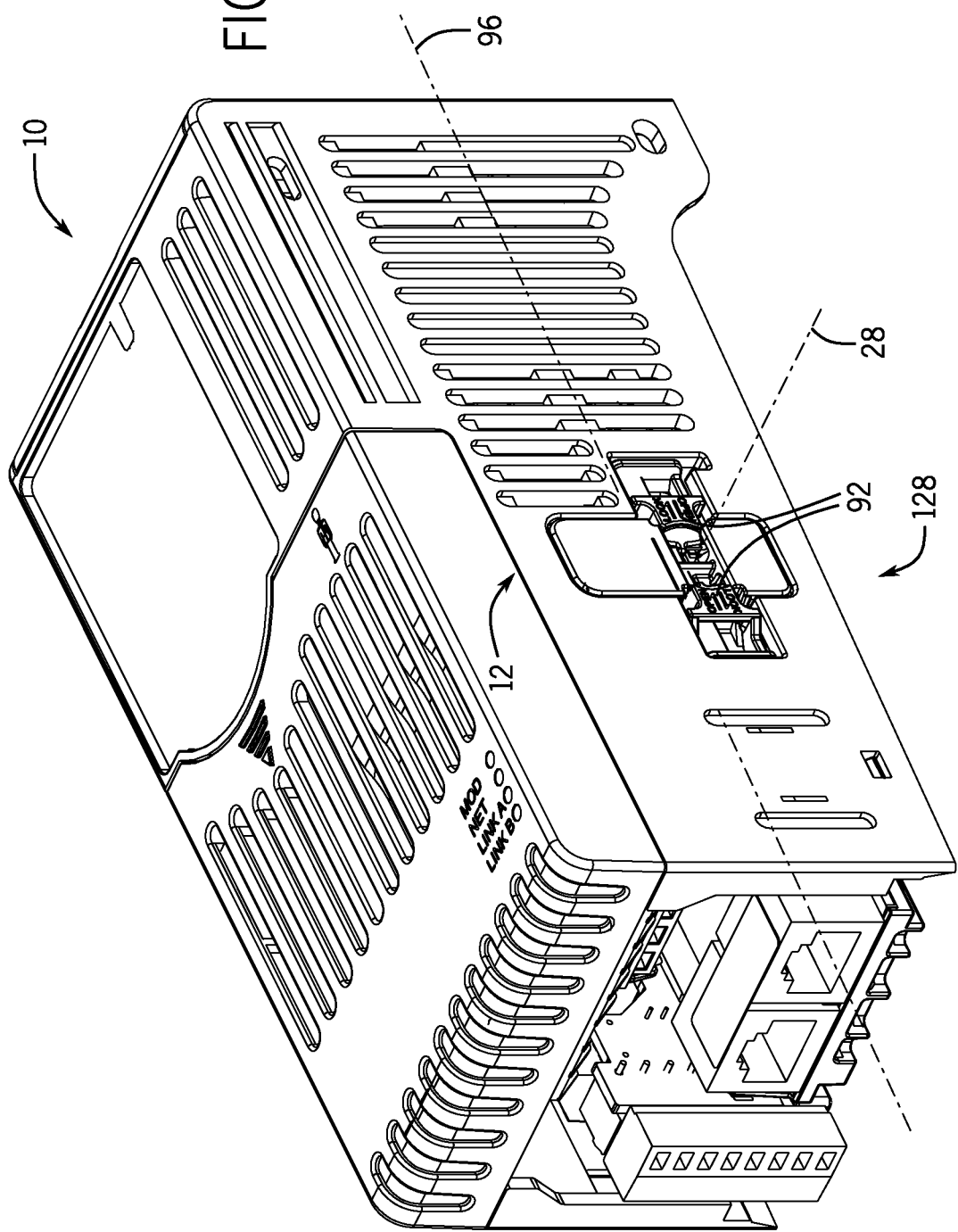
FIG. 9 is a perspective view of the internal cooling module of FIG. 2 in an installed position in the control module assembly, in accordance with embodiments of the present disclosure.

As will be described below, FIGS. 7-9 illustrate installation of the internal cooling module 12 into the control module assembly 10. FIG. 7 is a perspective view of an embodiment of the internal cooling module 12 in a transport position 120. As shown, the internal cooling module 12 is positioned adjacent to the control module assembly 10 such that moving the internal cooling module 12 in the first direction 52 along the longitudinal axis 28 may position the internal cooling module 12 within the control module assembly 10. While in the transport orientation or portion 120, the arms 92 are rotated about the rotation axis 114 such that the forward sides 104 of the arms 92 are substantially perpendicular (e.g., substantially transverse) the locking axis 96. It will be appreciated that in other embodiments the forward side 104 of each arm 92 may be approximately 20 degrees relative to the locking axis 96, approximately 30 degrees relative to the locking axis 96, approximately 40 degrees relative to the locking axis 96, approximately 50 degrees relative to the locking axis 96, approximately 60 degrees relative to the locking axis 96, approximately 70 degrees relative to the locking axis 96, approximately 80 degrees relative to the locking axis 96, or any other suitable angle relative to the locking axis 96. In other words, the arms 92 are substantially parallel to the longitudinal axis 28. While in the transport position 120, the operator may hold the internal cooling module 12 via engagement with the cavities 98. As a result, the operator's fingers may be substantially removed and isolated from the internal components of the control module assembly 10 while the internal cooling module 12 is being installed within the control module assembly 10. Additionally, the internal cooling module 12 may be installed using only one hand.

In the illustrated embodiment, the stay 40 is positioned above the latching feature 76, relative to the locking axis 96 (e.g., farther in the third direction 38 along the transverse axis 74). In other words, the stay 40 is orientated closer to the third side 20 than the latching feature 76. As described above, the latching feature 76 is configured to engage a projection of the control module assembly 10 while the control module assembly 10 is coupled to the power module assembly. The sixth side 26 (e.g., the back or rear side) of the control module assembly 10 is configured to engage the power module assembly, and to drive the projection into engagement with the latching feature 76. An example embodiment is discussed with respect to FIG. 15.

FIG. 8 is a perspective view of an embodiment of the internal cooling module 12 positioned within the control module assembly 10, in which the locking mechanism 70 is transitioning toward the installed position. As shown, the arms 92 are rotated about the rotation axis 114 such that the arms 92 are driven outward from the longitudinal axis 28. In other words, the arms 92 are moved toward the first side 16 of the control module assembly 10. For example, the operator may engage the arms via the cavities 98 and induce rotation of the arms 92 about the rotational axis 114 in an outward direction represented by a first arrow 124 and a second arrow 126. Moreover, as shown, the stay 40 and the latching feature 76 are substantially flush with the first side 16. As such, the operator may overcome the force of the release spring 50 to drive the PCB 34 into contact with the connector 82 while the internal cooling module 12 is installed in the control module assembly 10.

FIG. 9 is a perspective view of an embodiment of the internal cooling module 12 in an installed position 128 within the control module assembly 10. As shown, in the installed position 128, the arms 92 are substantially parallel to the locking axis 96. However, the arms 92 may not be in the locked position 90 while the locking mechanism 70 is in the installed position 128. For example, the locking mechanism 70 may transition to the installed position 128 from the transport position 120 before the arms are moved to the locked position 90. It will be appreciated that the PCB 34 may not be communicatively coupled to the connector 82 before the locking mechanism 70 is in the locked position 90. Accordingly, as mentioned above, the operational energy may not be supplied to the fan 30 until the internal cooling module 12 is secured within the control module assembly 10.

Figure 10:
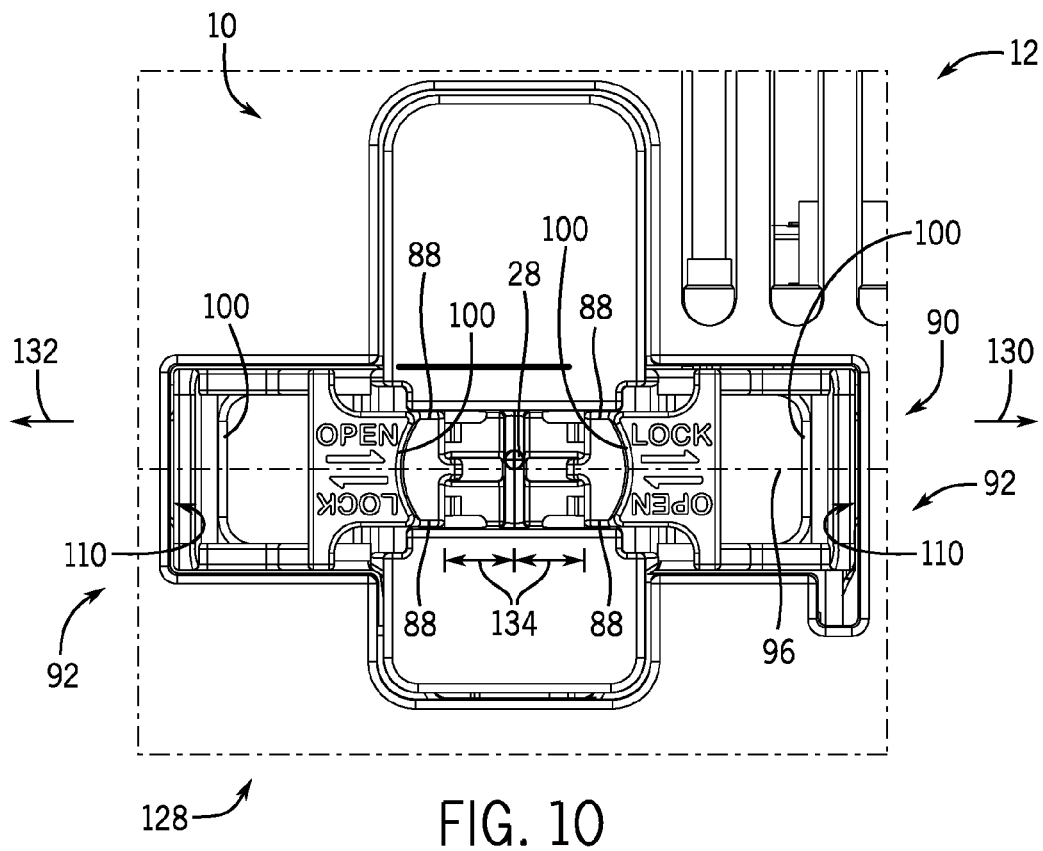
FIG. 10 is a front view of the internal cooling module of FIG. 2 in an installed position, in accordance with embodiments of the present disclosure.

FIG. 10 is a front view of an embodiment of the internal cooling module 12 in the installed position 128 within the control module assembly 10, in which the locking mechanism 70 is also in the locked position 90. In the illustrated embodiment, the arms 92 are engaged with the control module assembly 10 such that the locking features 110 block removal of the internal cooling mechanism 12. For example, the housing 14 may include slots that receive the locking feature 110. The arms 92 may be driven into the locked position 90 by engaging the arms 92 (e.g., via the locking edges 100) and moving the arms 92 along the locking axis 96 in the first locking direction 130 and the second locking direction 132, respectively. As a result, the internal cooling module 12 is coupled to the control module assembly 10 and operational energy is supplied to the fan 30.

As shown, the rotation features 88 of the arms 92 are positioned a first distance 134 from the longitudinal axis 28 in the locked position 90. While the rotation features 88 (e.g., rotation pivots, pivots) are at the first distance 134, the locking features 110 are configured to engage the control module assembly 10 to lock the internal cooling module 12 into the control module assembly 10. However, as will be described below, the rotation features 88 may shift along the locking axis 96 within the pockets 94 to transition the locking mechanism 70 to the unlocked position.

Figure 11:
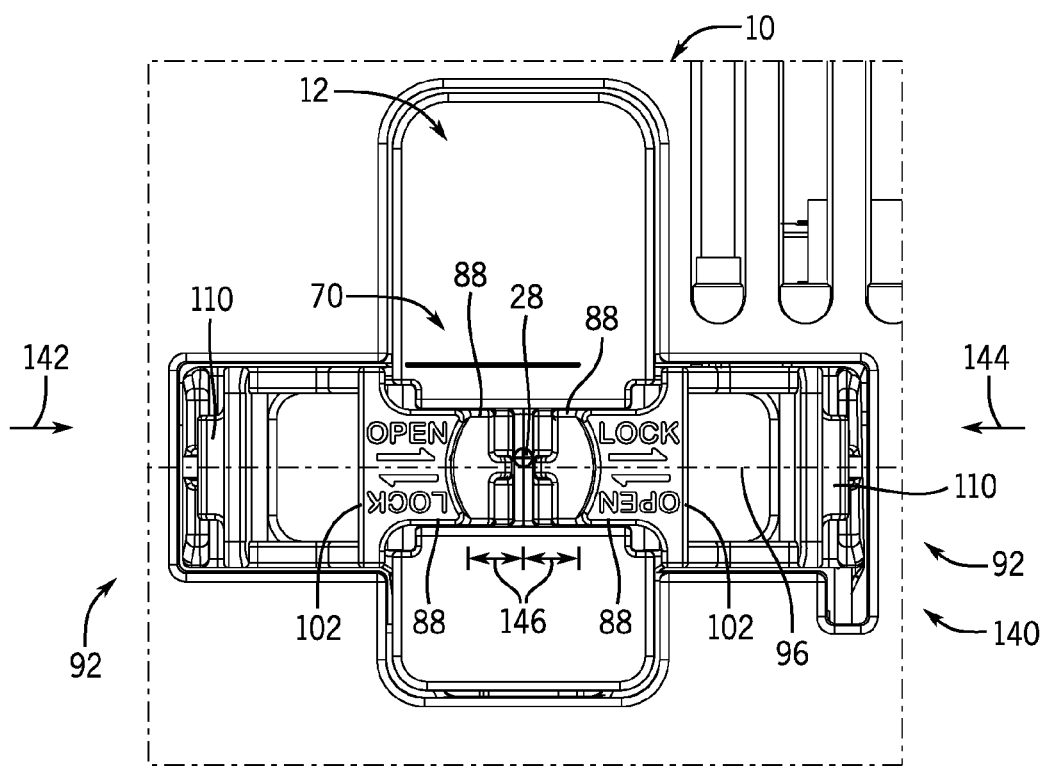
FIG. 11 is a front view of an embodiment of a locking mechanism of the internal cooling module of FIG. 2 in a locked position, in accordance with embodiments of the present disclosure.

FIG. 11 is a front view of an embodiment of the internal cooling mechanism 12, in which the locking mechanism 70 is in an unlocked position 140. As shown, while in the unlocked position 140, the locking features 110 of the arms 92 do not engage the control module assembly 10. As a result, the internal cooling mechanism 12 may be removed from the control module assembly 10. In certain embodiments, the release spring 50 may drive the internal cooling module 12 out of the control module assembly 10 in the second direction 54 while the locking mechanism 70 is in the unlocked position 140.

The locking mechanism 70 is driven toward the unlocked position 140 via engagement of the unlocking edges 102 by the operator. For example, the operator may drive the arms 92 along the locking axis 96 in a first unlocking direction 142 and a second unlocking direction 144, respectively, to transition to the unlocked position 140 from the locked position 90. While in the unlocked position 140, the rotation features 88 of the arms 92 may be at a second distance 146 from the longitudinal axis 28. As shown, the second distance 146 is less than the first distance 134 illustrated in FIG. 10. Accordingly, the arms 92 are closer to the longitudinal axis 28 and the locking features 110 do not engage the control module assembly 10, enabling the operator to rotate the arms 92 toward the transport position 120 to remove the internal cooling module 12 from the control module assembly 10.

Figure 12:
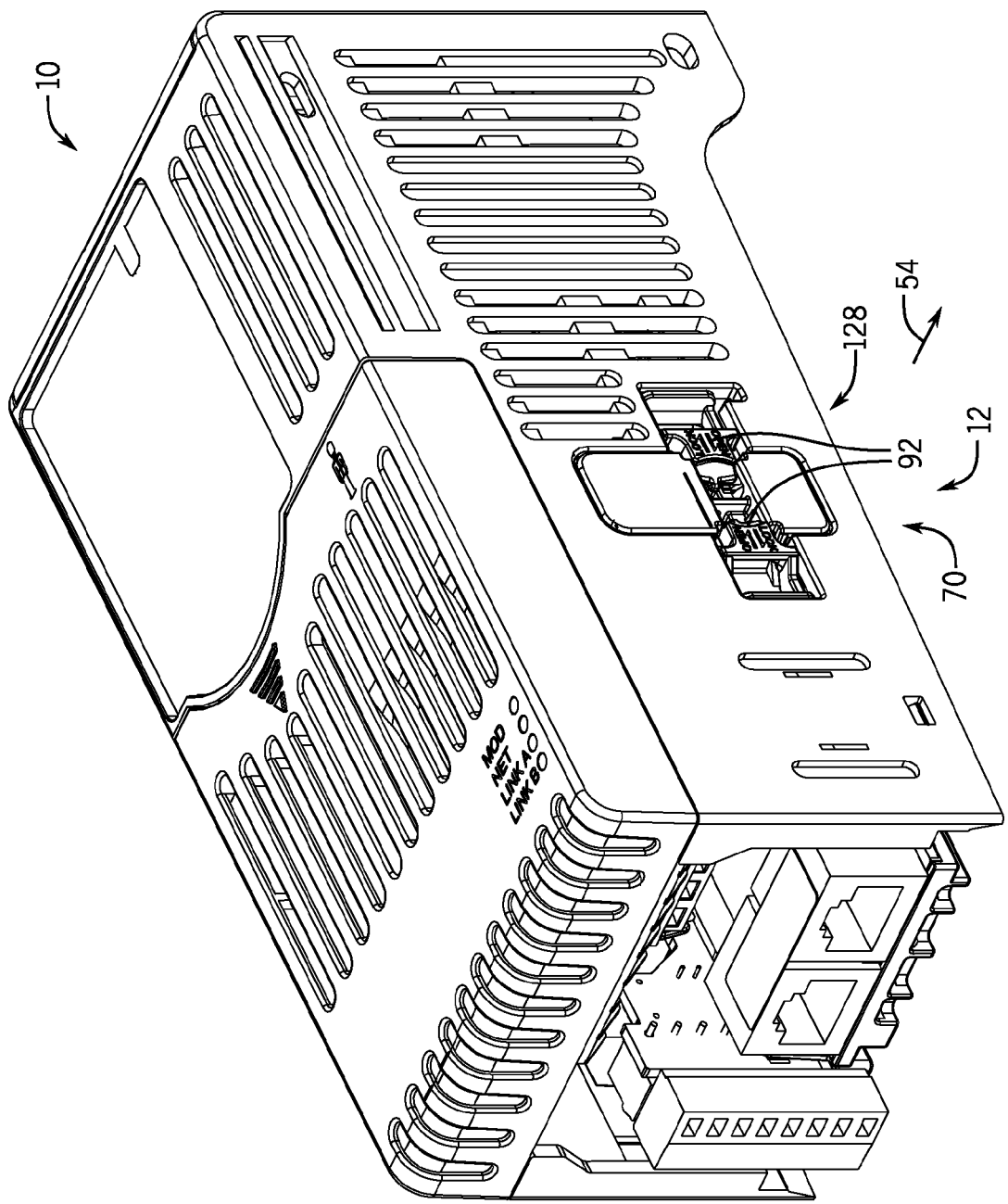
FIG. 12 is a perspective view of the internal cooling module of FIG. 2 in an installed position in the control module assembly, in accordance with embodiments of the present disclosure.
Figure 13:
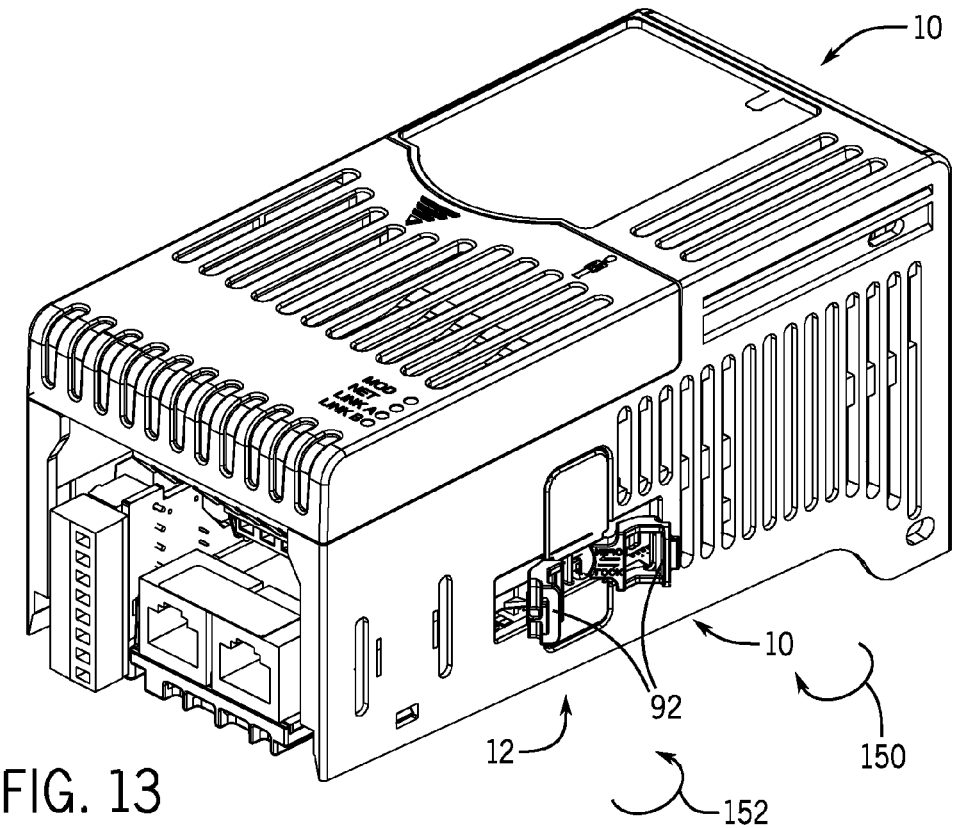
FIG. 13 is a perspective view of the internal cooling module of FIG. 2 positioned within the control module assembly, in which a locking mechanism is transitioning toward a transport position, in accordance with embodiments of the present disclosure.
Figure 14:
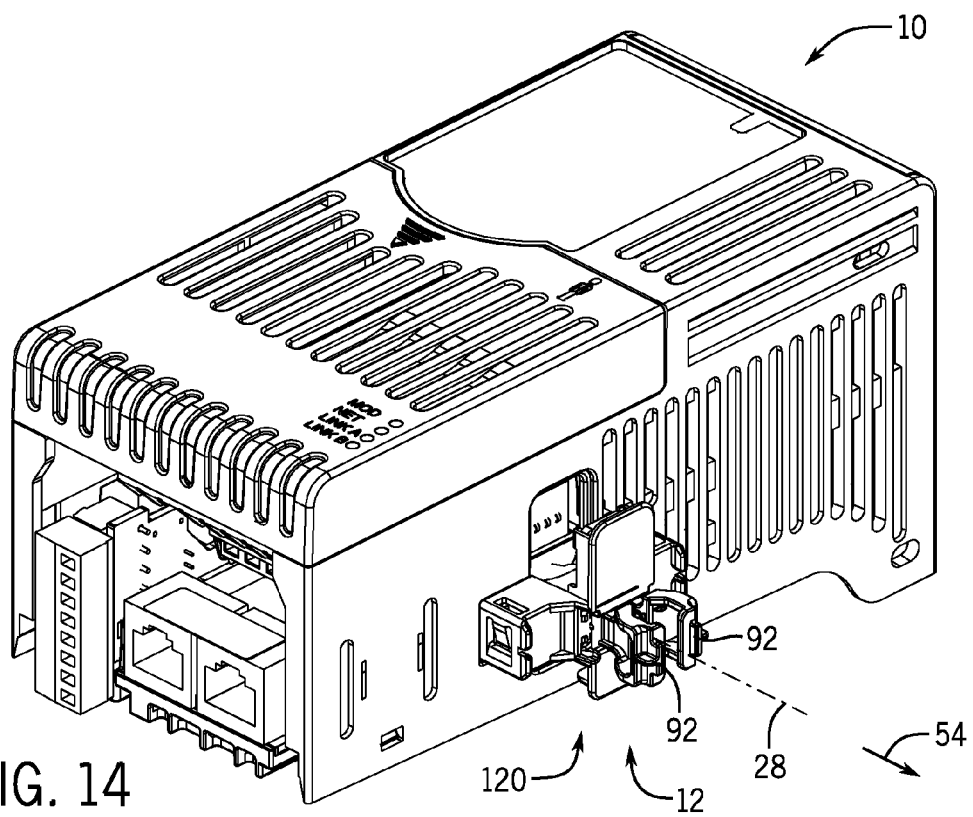
FIG. 14 is a perspective view of the internal cooling module of FIG. 2 in a transport position and being removed from the control module assembly, in accordance with embodiments of the present disclosure.

As will be described below, FIGS. 12-14 illustrate removal of the internal cooling module 12 from the control module assembly 10. FIG. 12 is a perspective view of an embodiment of the internal cooling module 12 in the installed position 128 positioned in the control module assembly 10, in which the locking mechanism 70 is in the unlocked position 140. As described above, while in the unlocked position 140 the locking features 110 of the arms 92 do not engage the control module assembly 10. As a result, the release spring 50 may drive the internal cooling module in the second direction 54 (e.g., out of the control module assembly 10). Accordingly, the electrical connection between the PCB 34 and the connector 82 may be disengaged, thereby stopping the supply of operational energy to the fan 30. Accordingly, the operator removing the internal cooling module 12 may be substantially isolated from a live electrical contact within the control module assembly 10.

FIG. 13 is a perspective view of an embodiment of the internal cooling module 12 positioned in the control module assembly 10, in which the locking mechanism 70 is transitioning toward the transport position 120. As described above, the arms 92 may rotate about the rotation axis 114. To transition toward the transport position 120, the arms 92 may rotate in an inward direction, represented by the third arrow 150 and the fourth arrow 152. As will be described below, transitioning the arms 92 to the transport position 120 may enable efficient removal of the internal cooling module 12 by the operator.

FIG. 14 is a perspective view of an embodiment of the internal cooling module 12 positioned proximate to the control module assembly 10, in which the locking mechanism 70 is in the transport position 120. As described above, the arms 92 are substantially parallel to the longitudinal axis 28. As a result, the operator may engage the internal cooling module 12 by holding the arms 92 via the cavities 98. Thereafter, the operator may move the internal cooling module 12 in the second direction 54 to remove the internal cooling module 12 from the control module assembly 10.

FIG. 15 is partial cross-sectional view of an embodiment of the control module assembly 10 engaging with a power module assembly 158, in which the internal cooling module 12 is installed within the control module assembly 10. In the illustrated embodiment, the locking mechanism 70 is in the locked position 90 and the PCB 34 is communicatively coupled to the connector 82. As described above, the latching feature 76 is configured to receive a projection 160 formed on the sixth side 26 of the control module assembly 10. In the illustrated embodiment, the recess 80 of the latching feature 76 is configured to receive the projection 160 while the control module assembly 10 is coupled to the power module assembly 158. Coupling the control module assembly 10 to the power module assembly 158 drives the projection 160 into the recess 80. As a result, the projection 160 is configured to block movement of the internal cooling module 12 in at least two directions while the control module assembly 10 is coupled to the power module assembly 158. For example, movement in the second direction 54 is blocked by the projection 160 engaging with the recess 80. Moreover, in the illustrated embodiment, movement along the locking axis 96 is also blocked by the projection 160 extending through the recess 80. However, while the control module assembly 10 is not coupled to the power module assembly 158, the internal cooling module 12 may be removed from the control module assembly 10 via the locking mechanism 70.

FIG. 16 is a flowchart of an embodiment of a method 170 for installing and removing the internal cooling module 12 from the control module assembly 10. The locking mechanism 70 is positioned in the transport position 120 at block 172. For example, the arms 92 may be rotated about the rotation axis 114 such that the arms 92 are substantially parallel with the longitudinal axis 28 of the frame 32. Accordingly, the operator may grasp the internal cooling module 12 by the arms 92 to enable installation while substantially maintaining isolation from the internal electrical components of the control module assembly 10. The internal cooling module 12 is inserted into the control module assembly 10 at block 174. For example, the internal cooling module 12 may be moved in the first direction 52 to position the internal cooling module 12 within the control module assembly 10. As a result, the internal cooling module 12 may be guided into engagement with the control module assembly 10 via the ribs 46. The arms 92 may be moved toward the installed position 128 at block 176. For example, the arms 92 may be driven to rotate about the rotation axis 114 along the first and second arrows 124, 126 in the outward direction. While the arms 92 are in the installed positon 128, the locking mechanism 70 may be transitioned to the locked position 90 at block 178. For example, the operator may engage the locking edges 100 to slide the arms 92 along the locking axis 96 in the first locking direction 130 and the second locking direction 132. As a result, the locking features 110 of the arms 92 may engage the control module assembly 10, thereby securing the internal cooling module 12 to the control module assembly 10.

To remove the internal cooling module 12, the arms 92 may be moved to the unlocked position 140 at block 180. For example, the arms 92 may be moved along the locking axis 96 in the first and second unlocking directions 142, 144 via engagement with the unlocking edges 102. In certain embodiments, the locking mechanism 70 is positioned in the transport position 120 at block 182. For example, the arms 92 may be rotated about the rotation axis 114 in the inward direction along the third and fourth arrows 150, 152. Thereafter, the internal cooling module 12 may be removed from the control module assembly 10 at block 184. For example, the internal cooling module 12 may be moved in the second direction 54 to remove the internal cooling module 12 from the control module assembly 10. Accordingly, the internal cooling module 12 may be installed into the control module assembly 10 and removed from the control module assembly 10 without the use of additional tools or fastening devices.

As described in detail above, the internal cooling module 12 is configured to lock to the control module assembly 10 to position the fan 30 within the cooling module 12. In certain embodiments, the internal cooling module 12 includes the locking mechanism 70 to enable the transition between the locked position 90 and the unlocked position 140. Moreover, the locking mechanism 70 enables installation and removal of the internal cooling module 12 without utilizing additional tools or fasteners. As a result, the internal cooling module 12 may be efficiently installed and/or removed from the control module assembly 10.

While only certain features of present embodiments have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A cooling system for an automatic control component, comprising:
   a frame comprising a front side, a back side, a first side wall, and a second side wall;
   a stay coupled to the frame;
   a locking mechanism coupled to the front side of the frame, wherein the locking mechanism is configured to move between a locked position and an unlocked position to secure the frame to a control module assembly;
   a fan positioned within the frame, wherein the fan is configured to cool internal electronics of the control module assembly and the fan receives operative energy from the control module assembly; and
   a printed circuit board secured within the stay and configured to receive power from the control module assembly and supply power to the fan.

2. The system of claim 1, comprising a latching feature coupled to the frame, wherein the latching feature comprises a recess configured to receive a projection to block movement of the frame in at least two directions while the frame is secured to the control module assembly.

3. The system of claim 2, comprising the control module assembly and a power module assembly configured to receive the control module assembly while the cooling system is installed within the control module assembly, wherein the projection is formed on the control module assembly and is configured to flex through the recess of the latching feature while the control module assembly is secured to the power module assembly.

4. The system of claim 1, comprising a spring catch on the first side wall and a fixed catch on the second side wall, opposite the first side wall, wherein the spring catch is configured to drive the fan positioned within the frame toward the second side wall.

5. The system of claim 1, comprising a release spring positioned on the back side, wherein the release spring is configured to drive the frame in a direction toward the front side of the frame while the release spring is compressed.

6. The system of claim 1, wherein the locking mechanism comprises:
   an arm comprising a rotation feature configured to enable rotation of the arm about a rotation axis;
   a first portion of the arm positioned proximate to the rotation feature, wherein the first portion of the arm is at a first longitudinal position along a longitudinal axis of the frame;
   a second portion of the arm at a second longitudinal position along the longitudinal axis, the first longitudinal position being farther along the longitudinal axis relative to the frame than the second longitudinal position; and
   a cavity extending through the second portion of the arm.

7. The system of claim 6, comprising a pocket of the frame, wherein the rotation feature is positioned in the pocket and configured to move in a first direction and a second direction, the second direction opposite the first direction, to move the locking mechanism between the locked position and the unlocked position.

8. The system of claim 6, comprising a locking feature positioned on the arm, wherein the locking feature is configured to engage the control module assembly while the locking mechanism is in the locked position.

9. The system of claim 1, comprising ribs extending from the back side of the frame, wherein the ribs are configured to facilitate alignment of the frame with the control module assembly.

10. The system of claim 1, wherein the stay comprises a first grip and a second grip configured to engage the printed circuit board such that the printed circuit board is substantially fixed to the frame.

11. The system of claim 1, wherein the stay is integral with the frame.

12. A system, comprising:
a control module assembly configured to control operation of an automated system;
an internal cooling module configured to engage the control module assembly, wherein the internal cooling module facilitates cooling of internal electronic components of the control module assembly;
a projection of the control module assembly, wherein the projection is configured to engage the internal cooling module and block removal of the internal cooling module from the control module assembly;
a fan of the internal cooling module, wherein the fan is configured to operationally engage the control module assembly such that the control module assembly provides operational energy to the fan; and
a power module assembly configured to receive the control module assembly, wherein the power module assembly is configured to drive the projection of the control module assembly into engagement with the internal cooling module.

13. The system of claim 12, comprising a locking mechanism of the internal cooling module, wherein the locking mechanism rotatably and slidably engages at least one side of the control module assembly while in a locked position and the locking mechanism does not engage the at least one side of the control module assembly while in an unlocked position.

14. The system of claim 12, comprising a latching feature of the internal cooling module, wherein the latching feature comprises a recess configured to receive the projection while the control module assembly is coupled to the power module assembly to block removal of the internal cooling module from the control module assembly.

15. The system of claim 12, wherein the internal cooling module may be installed within the control module assembly without additional tools or fasteners.

16. A method comprising:
guiding an internal cooling module into engagement with a control module assembly with ribs of the internal cooling module;
rotating a locking mechanism toward an installed position, in which an arm of the locking mechanism is substantially parallel to a side of a control module housing; and
sliding the locking mechanism along a locking axis in a first locking direction and a second locking direction into a locked position such that the locking mechanism engages the side of the control module housing.

17. The method of claim 16, extending the locking mechanism into a transport position, in which the arm is oriented substantially perpendicular to the side of the control module assembly while in the transport position.

18. The method of claim 16, comprising overcoming a biasing force acting in a second direction, opposite a first direction, to operatively couple a fan of the internal cooling module to the control module assembly.

19. The method of claim 16, comprising sliding the locking mechanism in a first unlocking direction and a second unlocking direction along the locking axis such that the locking mechanism transitions to an unlocked position from the locked position.

20. The method of claim 16, wherein moving the locking mechanism into a locked position comprises engaging the side of the control module assembly with a locking feature such that the locking feature substantially blocks movement of the integral cooling module in a second direction, opposite a first direction.

* * * * *